United States Patent
Kang

(10) Patent No.: US 8,111,576 B2
(45) Date of Patent: Feb. 7, 2012

(54) HIGH-VOLTAGE SAWTOOTH CURRENT DRIVING CIRCUIT AND MEMORY DEVICE INCLUDING SAME

(75) Inventor: Yong Hoon Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 268 days.

(21) Appl. No.: 12/620,760

(22) Filed: Nov. 18, 2009

(65) Prior Publication Data

US 2010/0128552 A1 May 27, 2010

(30) Foreign Application Priority Data

Nov. 25, 2008 (KR) .................. 10-2008-0117615

(51) Int. Cl.
*G11C 7/02* (2006.01)
(52) U.S. Cl. .................................... 365/226; 327/131
(58) Field of Classification Search .............. 365/226; 327/131
See application file for complete search history.

(56) References Cited

U.S. PATENT DOCUMENTS 6,989,694 B2 1/2006 Garnier et al.
7,847,621 B2 * 12/2010 Oyama et al. .............. 327/536

FOREIGN PATENT DOCUMENTS

| JP | 2000047740 A | 2/2000 |
| JP | 2005086928 A | 3/2005 |
| KR | 1020060009549 A | 2/2006 |

* cited by examiner

*Primary Examiner* — Hoai V Ho
(74) *Attorney, Agent, or Firm* — Volentine & Whitt, PLLC

(57) ABSTRACT

A high-voltage sawtooth current driving circuit and a memory device including the same are described. In the high-voltage sawtooth current driving circuit includes a charge pump circuit configured to output a first voltage, a regulating circuit configured to regulate a second voltage using the first voltage output from the charge pump circuit, and a sawtooth current driver configured to generate a sawtooth current in response to the second voltage regulated by the regulating circuit.

15 Claims, 6 Drawing Sheets

HIGH-VOLTAGE SAWTOOTH CURRENT DRIVING CIRCUIT AND MEMORY DEVICE INCLUDING SAME

CROSS-REFERENCE TO RELATED APPLICATIONS

This application claims the benefit of Korean Patent Application No. 10-2008-0117615 filed on Nov. 25, 2008, the subject matter of which is hereby incorporated by reference.

BACKGROUND

Embodiments of the present inventive concept relate to semiconductor devices, and more particularly to a high-voltage sawtooth current driving circuit adapted for use in semiconductor devices, wherein the high-voltage sawtooth current driving circuit is characterized by charge pump having reduced size.

In semiconductor devices, such as phase-change random access memory (PRAM) and resistive random access memory (RRAM), certain operations (e.g., write, read, and/or erase) may be performed in relation to memory cells using voltages or currents having a sawtooth waveform. Many of these sawtooth signals are generated with a voltage level higher than a power supply voltage (e.g., Vcc) supplied to the semiconductor device. In order to generate "high-voltage" signals (i.e., signals higher than the power supply voltage), charge pump circuits capable of boosting the external power supply voltage are commonly used. However, as the magnitude of a sawtooth current increases, the size of a conventional charge pump circuit increases proportionally, and the charge pump circuit ends up occupying a much larger area than is desired. Large charge pump circuit size inhibits overall efforts to miniaturize the constituent hardware in many types of portable host devices.

Since the output of conventional charge pump circuits is directly related to a sawtooth current driver and since the charge pump circuit must output a relatively high peak current for the sawtooth current, not only does the size of the charge pump circuit increase, but also the charge pump circuit consumes a large amount of instantaneous current.

SUMMARY

Embodiments of the inventive concept provide a high-voltage sawtooth current driving circuit having reduced size for a constituent charge pump circuit. In one aspect, this charge pump circuit size reduction is accomplished by decreasing the level of the peak pump current as compared with conventional charge pump circuits. Embodiments of the inventive concept also provide semiconductor devices, such as memory devices, incorporating this type of high-voltage sawtooth current driving circuit.

According to one embodiment of the inventive concept, there is provided a high-voltage sawtooth current driving circuit comprising; a charge pump circuit configured to output a first voltage, a regulating circuit configured to regulate a second voltage using the first voltage output from the charge pump circuit, and a sawtooth current driver configured to generate a sawtooth current in response to the second voltage regulated by the regulating circuit.

In one related aspect, the first voltage may be higher than the second voltage.

In another related aspect, the regulating circuit may comprise; a sensing circuit configured to sense a change in the second voltage, a switching circuit connected between a first node at which the first voltage is apparent and a second node at which the second voltage is apparent, and configured to switch in response to an output of the sensing circuit, and a charge circuit connected between an output terminal of the charge pump circuit and ground.

In another related aspect, the regulating circuit comprises; the regulating circuit may comprise; a switching circuit connected between a first node at which the first voltage is apparent and a second node at which the second voltage is apparent, and configured to switch according to a change in the second voltage, and a charge circuit connected between an output terminal of the charge pump circuit and ground.

According to another embodiment of the inventive concept, there is provided a high-voltage sawtooth current driving circuit, comprising; a sawtooth current driver configured to generate a sawtooth current in response to a second voltage having a level less than a level of a first voltage provided by a charge pump circuit, wherein a pump current provided by the charge pump has a level less than a peak level of the sawtooth current, and a regulating circuit configured to regulate the level of the second voltage based on a difference between the sawtooth current and the pump current.

According to another embodiment of the inventive concept, there is provided a memory device comprising; a high-voltage sawtooth current driving circuit configured to generate a sawtooth current; and a memory array performing at least one of write, read, and erase operations using the sawtooth current, wherein the high-voltage sawtooth current driving circuit comprises; a charge pump circuit configured to output a first voltage, a regulating circuit configured to regulate a second voltage using the first voltage output from the charge pump circuit, and a sawtooth current driver configured to generate a sawtooth current in response to the second voltage regulated by the regulating circuit.

DETAILED DESCRIPTION OF THE EMBODIMENTS

Embodiments of the inventive concept now will be described in some additional detail with reference to the accompanying drawings. The inventive concept may, however, be embodied in many different forms and should not be construed as being limited to only the illustrated embodiments. Rather, these embodiments are presented as teaching examples. Throughout the written description and drawings, like reference numbers and labels are used to denote like or similar elements, signals, etc.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
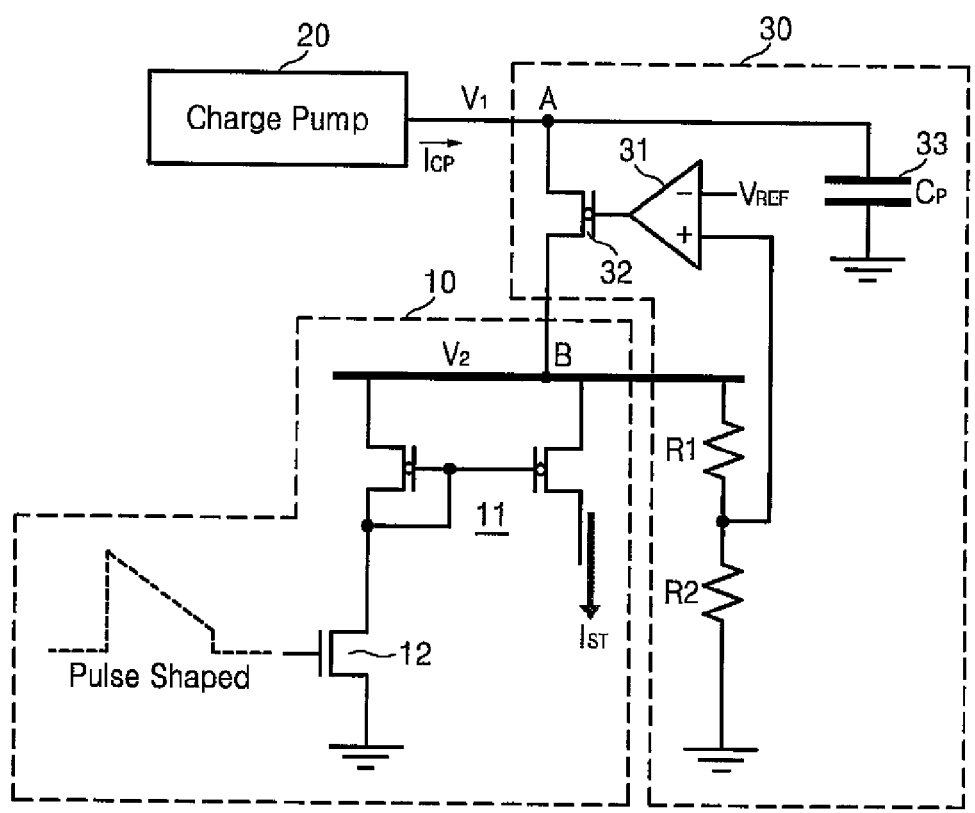
FIG. 1 is a schematic circuit diagram of a high-voltage sawtooth current driving circuit according to an embodiment of the inventive concept.

FIG. 1 is a schematic circuit diagram of a high-voltage sawtooth current driving circuit according to an embodiment of the inventive concept. The high-voltage sawtooth current driving circuit comprises a sawtooth current driver 10, a charge pump circuit 20, and a regulating circuit 30.

The sawtooth current driver 10 is driven by a second voltage V2, e.g., a voltage at a node B. In order to stably output a sawtooth current $I_{ST}$, the magnitude of the second voltage V2 driving the sawtooth current driver 10 needs to be constant. For clarity of the description, the second voltage V2 apparent at the node B (a second node) is regulated to be 4.0 V in certain embodiments of the inventive concept, like the one illustrated in FIG. 1. However, the magnitude of the second voltage V2 may be variously defined in other embodiments.

The sawtooth current driver 10 comprises a current mirror circuit 11 and an input transistor 12 connected to the current mirror circuit 11. A pulse-shaped control voltage is applied to the gate of the input transistor 12. In response to the pulse-shaped control voltage, a predetermined current having a sawtooth waveform begins to flow through the current mirror circuit 11.

The resulting sawtooth current $I_{ST}$ provided by the sawtooth current driver 10 has a cycle that begins at a low level, then "instantaneously increases" (i.e., rises as instantaneously as is practically possible) to a peak level, and then gradually falls returning to the low level. When the sawtooth current $I_{ST}$ reaches the peak level, the second voltage V2 decreases momentarily, thereby adversely affecting the performance of the high-voltage sawtooth current driving circuit. Accordingly, an operation of restoring the second voltage V2 to its defined level is required.

The charge pump circuit 20 outputs a first voltage V1 higher than the second voltage V2 at node A (a first node). In certain embodiments of the inventive concept, the first voltage V1 will be output at 6.0 V, but the magnitude of the first voltage V1 may vary in different embodiments. The charge pump circuit 20 outputs a pump current $I_{CP}$ having a level that may be less than the peak current level of the sawtooth current $I_{ST}$. For example, the level of the pump current $I_{CP}$ may be substantially the same as the mean of the sawtooth current $I_{ST}$. This relationship between the pump current $I_{CP}$ and the peak of the sawtooth current $I_{ST}$ distinguishes conventional charge pump circuits that require the output of a pump current having a level equal to the peak of a sawtooth current. However, in certain embodiments of the inventive concept, this relationship allows the size of the charge pump circuit 20 to be remarkably reduced as compared to conventional charge pump circuits.

In addition, the regulating circuit 30 charges the node B to regulate the level of the second voltage V2, thereby compensating for the lack of current occurring when the pump current $I_{CP}$ is less than the peak of the sawtooth current $I_{ST}$. In the illustrated embodiment of FIG. 1, the regulating circuit 30 comprises; a sensing circuit 31, a switching circuit 32, and a charge circuit 33.

The sensing circuit 31 senses a drop in the second voltage V2 driving the sawtooth current driver 10. In the illustrated embodiment, the sensing circuit 31 is implemented as a comparator 31. The comparator 31 essentially compares the second voltage V2 with a reference voltage $V_{REF}$ to sense any drop in the second voltage V2. That is, a voltage indicative of the second voltage V2 obtained by dividing the second voltage V2 using a plurality of resistors is applied to one terminal (e.g., a positive (+) input terminal) of the comparator 31, and the reference voltage $V_{REF}$ is applied to another input terminal (e.g., a negative (−) input terminal) of the comparator 31.

In the embodiment illustrated in FIG. 1 in which the second voltage V2 is regulated to 4.0 V, the reference voltage $V_{REF}$ may be set to be 4V×R2/(R1+R2), and the comparator 31 may sense a drop in the second voltage V2. That is, when the second voltage V2 decreases when the sawtooth current $I_{ST}$ reaches its peak, the voltage applied to the positive input terminal of the comparator 31 is less than the reference voltage $V_{REF}$. Therefore, the comparator 31 outputs a low comparison signal.

The switching circuit 32 is turned ON in response to the comparison signal provide by the comparator 31, so that the dropped second voltage V2 (i.e., the voltage apparent at the second node B) is charged by a charge voltage (e.g., 6 V) provided by the charge circuit 33 (e.g., capacitor $C_P$) so that the second voltage V2 returns to 4.0 V. Thus, when the second voltage V2 momentarily drops, it is again charged to its defined level of 4.0 V by the comparing, discharging, and switching operations of the regulating circuit 30. Once the second voltage V2 is fully restored to its defined level, the comparator 31 outputs a high comparison signal and the switching circuit 32 is turned OFF. While the switching circuit 32 is being turned OFF, the charge voltage provided by the charge circuit 33 that may have decreased due to the foregoing discharging operation may be recharged by the output voltage of the charge pump circuit 20.

In other words, the (driving) second voltage V2 provided to the sawtooth current driver 10 may be set at a level different from the level of the (charge pump) first voltage provided by the charge pump circuit 20. Nonetheless, the charge circuit 33 is disposed at an output terminal of the charge pump circuit 20 to charge-up the second voltage V2 using the first voltage V1 provided by the charge pump circuit 20, as needed. In this manner, and a driving voltage (second voltage V2) applied to the sawtooth current driver 10 may be regulated and maintained constant by the regulating circuit 30, so that power may be properly provided to the sawtooth current driver 10.

Figure 2:
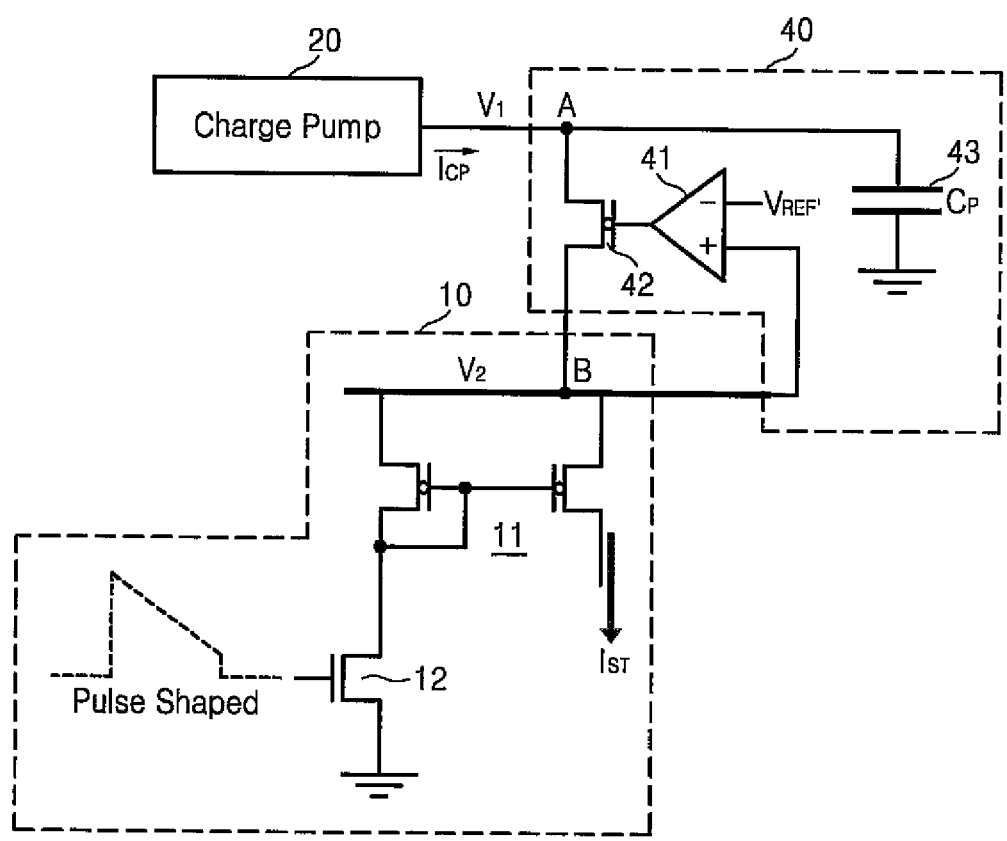
FIG. 2 is a schematic circuit diagram of a high-voltage sawtooth current driving circuit according to another embodiment of the inventive concept.

FIG. 2 is a schematic circuit diagram of a high-voltage sawtooth current driving circuit according to another embodiment of the inventive concept. Referring to FIGS. 1 and 2, the high-voltage sawtooth current driving circuit shown in FIG. 2 comprises the sawtooth current driver 10, the charge pump circuit 20, and a regulating circuit 40. The operation and structure of the sawtooth current driver 10 and charge pump circuit 20 are substantially similar between the embodiments illustrated in FIGS. 1 and 2.

However, the regulating circuit 40 of the embodiment illustrated in FIG. 2 comprises a sensing circuit 41, a switching circuit 42, and a charge circuit 43. The sensing circuit 41 is again implemented using a comparator 41 having two input terminals. However, unlike the comparator 31 of FIG. 1, the comparator 41 of FIG. 2 directly receives the second voltage V2 as an input to one of its input terminals (e.g., a positive (+) input terminal). A reference voltage $V_{REF}'$ is again applied to the other input terminal (e.g., a negative (−) input terminal).

Accordingly, the comparator 41 may sense a drop of the second voltage V2 by directly comparing the second voltage V2 with the reference voltage $V_{REF}'$. For example, assuming that the second voltage is regulated to 4.0 V, the reference voltage $V_{REF}'$ may be set to 4.0 V. Here again, as the sawtooth current $I_{ST}$ reaches its peak level, the second voltage V2 may decrease momentarily. But this momentary decrease may be compensated for by operation of the comparator 41 as described above.

More particularly, the switching circuit 42 may be turned ON in response to (e.g.) a low the comparison signal and a charge voltage from the charge circuit 43 may be used to charge the second voltage V2, thereby restoring it to its original level (e.g., 4.0 V). Similarly, when the second voltage is restored to its original level, the comparator 41 will output a high comparison signal. In response, the switching circuit 42 is turned OFF, and the charge circuit 43 is charged by the first voltage (e.g., 6.0 V) provided by the charge pump circuit 20.

Similar to the embodiment illustrated in FIG. 1, the pump current $I_{CP}$ output from the charge pump circuit 20 may be less than the peak of the sawtooth current $I_{ST}$. For example, the level of the pump current $I_{CP}$ may be substantially the same as the mean of the sawtooth current $I_{ST}$. Since the level of the pump current $I_{CP}$ provided by the charge pump circuit 20 may be reduced, the size of the charge pump circuit 20 can be remarkably reduced.

Figure 3:
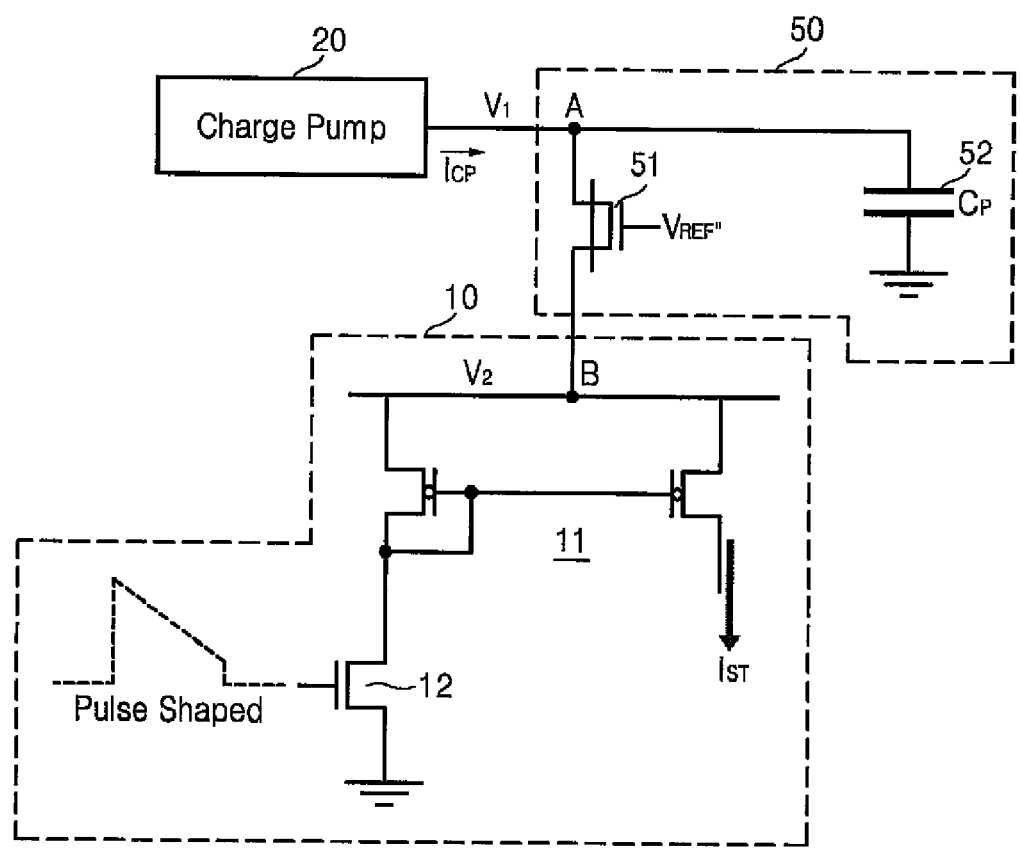
FIG. 3 is a schematic circuit diagram of a high-voltage sawtooth current driving circuit according to yet another embodiment of the inventive concept.

FIG. 3 is a schematic circuit diagram of a high-voltage sawtooth current driving circuit according to yet another embodiment of the inventive concept. The high-voltage sawtooth current driving circuit illustrated in FIG. 3 comprises the sawtooth current driver 10, the charge pump circuit 20, and a regulating circuit 50. Again, the operation and structure of the sawtooth current driver 10 and the charge pump circuit 20 illustrated in FIG. 3 are substantially the same as those of the corresponding elements 10 and 20 illustrated in FIGS. 1 and 2.

Referring to FIGS. 1 through 3, the regulating circuit 50 comprises a switching circuit 51 and a charge circuit 52. The switching circuit 51 is connected between node B (e.g., the second B at which the second voltage V2 is apparent) and node A (e.g., a first node at which the first voltage V1 is apparent). The charge circuit 52 is connected to the output terminal of the charge pump circuit 20 and provides a charge voltage to node A according to the operation of the switching circuit 51.

The switching circuit 51 may be implemented as a depletion-mode transistor. When the switching circuit 51 is implemented by a depletion-mode transistor, the drop of the second voltage may be easily sensed. That is, when a difference between a reference voltage $V_{REF}''$ applied to the gate of the depletion-mode transistor 51 and a threshold voltage Vth of the depletion-mode transistor 51 is set to a defined level for the second voltage V2 (e.g., 4 V), the depletion-mode transistor 51 will be turned ON/OFF according to a drop in the second voltage V2.

In other words, a current flowing through the depletion-mode transistor 51 is proportional to (Vgs−Vth) which may be re-written as (Vg−Vth−Vs), where Vgs denotes the gate-to-source voltage, Vg denotes the gate voltage, and Vs denotes the source voltage. Since the source of the depletion-mode transistor 51 is connected to node B (the second voltage V2), when the second voltage V2 drops, the depletion-mode transistor 51 is turned ON and charge voltage provided by the charge circuit 52 is discharged so that the dropped second voltage V2 is restored to its defined level. Similarly, when the second voltage V2 is at its defined level, the depletion-mode transistor 51 is turned OFF, and the charge circuit 52 may be recharged by the first output voltage (e.g., 6.0 V) provided by the charge pump circuit 20.

Similarly to the embodiments illustrated in FIGS. 1 and 2, the pump current $I_{CP}$ output from the charge pump circuit 20 may be less than the peak of the sawtooth current $I_{ST}$. For example, the level of the pump current $I_{CP}$ may be substantially the same as the mean of the sawtooth current $I_{ST}$. Since the level of the pump current $I_{CP}$ that the charge pump circuit 20 needs to output is reduced, the size of the charge pump circuit 20 can be remarkably reduced.

Figure 4:
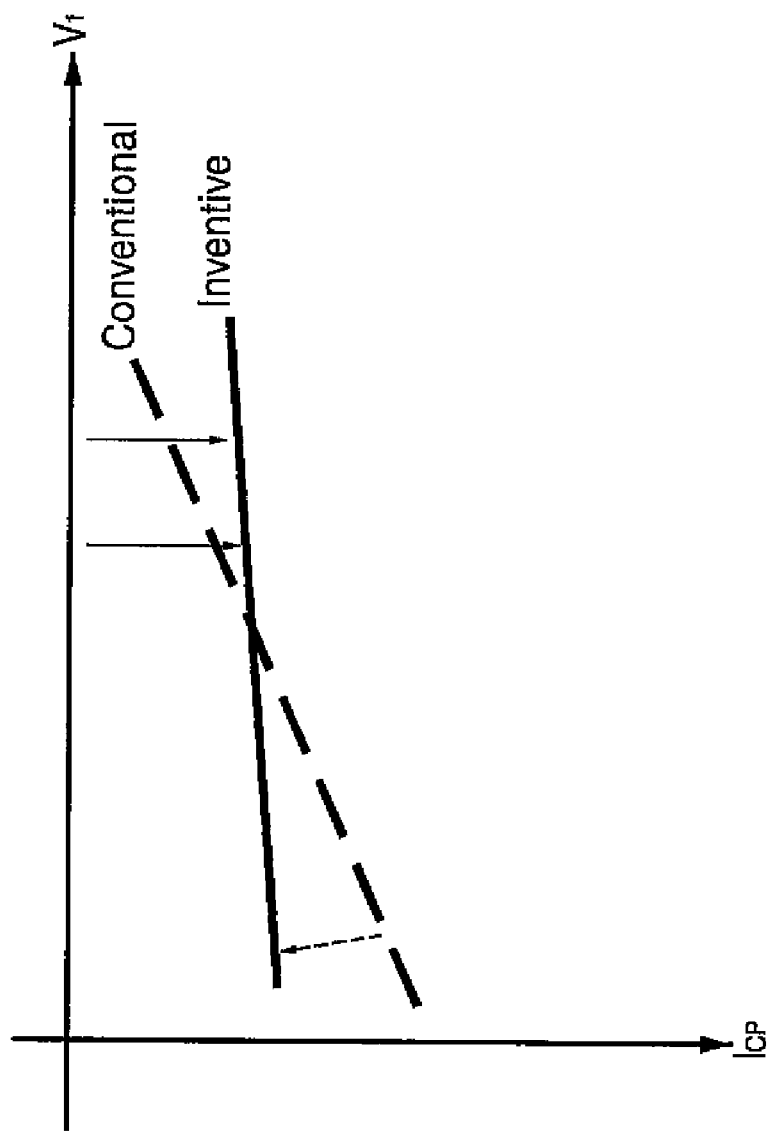
FIG. 4 is a graph illustrating a relationship between output voltage and pump current for an embodiment of the inventive concept as compared with a conventional circuit.

FIG. 4 is a graph illustrating a relationship between the first voltage V1 provided by a charge pump circuit and pump current $I_{CP}$ according to an embodiment of the inventive concept, as compared with a conventional circuit. Referring to FIGS. 1 through 4, the charge pump circuit 20 is assumed to generate a first voltage V1 (e.g., 6.0 V) that is higher than a power supply voltage (e.g., 4.0 V) externally supplied to conventional devices. Therefore, a pump current $I_{CP}$ insensitive to the first voltage V1 (or the voltage apparent at node A) may be generated by optimizing the operation of charge pump circuit 20.

Referring to FIG. 4, while the pump current $I_{CP}$ decreases with a steep slope in relation to a decreasing first voltage V1 provided by a charge pump circuit in the conventional example, the charge pump circuit 20 generates the pump current $I_{CP}$ which hardly decreases with decreases in the level of the first voltage V1 for an inventive example, according to an embodiment of the inventive concept. Accordingly, within embodiments of the inventive concept, the size of the charge pump circuit 20 may be remarkably reduced and any decrease in pump current $I_{CP}$ may be minimized even as the first voltage V1 changes.

Figure 5:
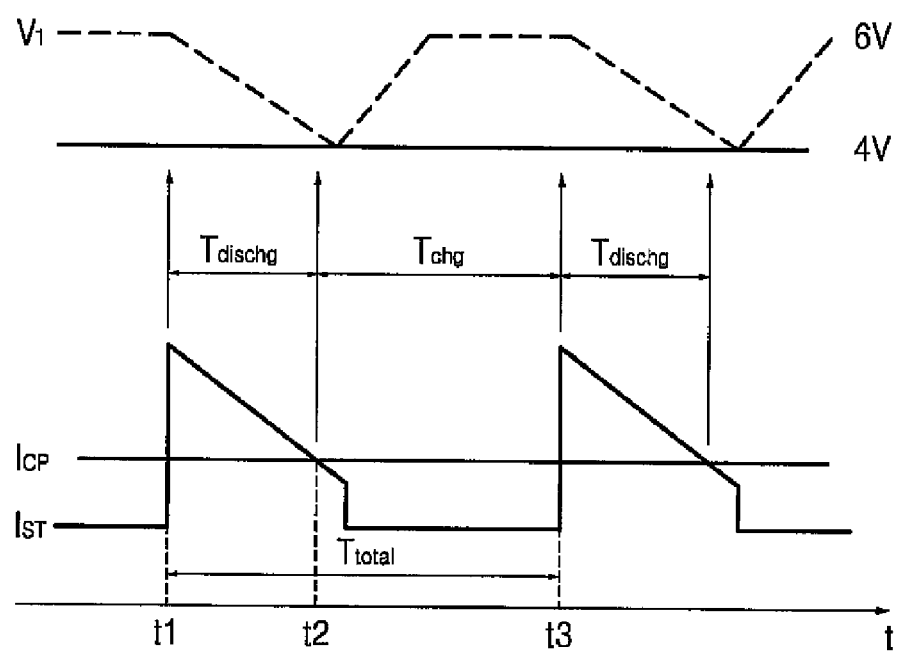
FIG. 5 is a graph illustrating a relationship between the output voltage of a charge pump circuit, the pump current, and the sawtooth current according to an embodiment of the inventive concept.

FIG. 5 is a graph illustrating relationships between the first (output) voltage V1 provided by the charge pump circuit 20, the pump current $I_{CP}$, and the sawtooth current $I_{ST}$ according to an embodiment of the inventive concept. Referring to FIGS. 1 through 5, the charge pump circuit 20 outputs the first voltage (e.g., 6.0 V) and the sawtooth current driver 10 is driven by the second voltage (e.g., 4.0 V).

When the sawtooth current $I_{ST}$ reaches the peak level at a first time "t1", the switching circuit 32, 42, or 51 is turned ON. Therefore, the charge voltage provided by the charge circuit 33, 43, or 52 is discharged, decreasing the first voltage V1 and restoring the second voltage V2. During a discharge period $T_{dischg}$ between the first time "t1" and a second time "t2" while the sawtooth current $I_{ST}$ is greater than the pump current $I_{CP}$ output from the charge pump circuit 20, the switching circuit 32, 42, or 51 is turned ON, so that the charge voltage provided by the charge circuit 33, 43, or 52 is discharged.

During a charge period $T_{chg}$ between the second time "t2" and a third time "t3" while the sawtooth current $I_{ST}$ is less than the pump current $I_{CP}$ output from the charge pump circuit 20, the switching circuit 32, 42, or 51 is turned OFF. Therefore, the charge circuit 33, 43, or 52 is charged by the first voltage V1 provided by the charge pump circuit 20. In other words, the discharge and charge operations of the charge circuit 33, 43, or 52 are performed during a single cycle $T_{total}$ of the sawtooth current $I_{ST}$, so that the second voltage (e.g., 4.0 V) for driving the sawtooth current driver 10 may be properly regulated.

Figure 6:
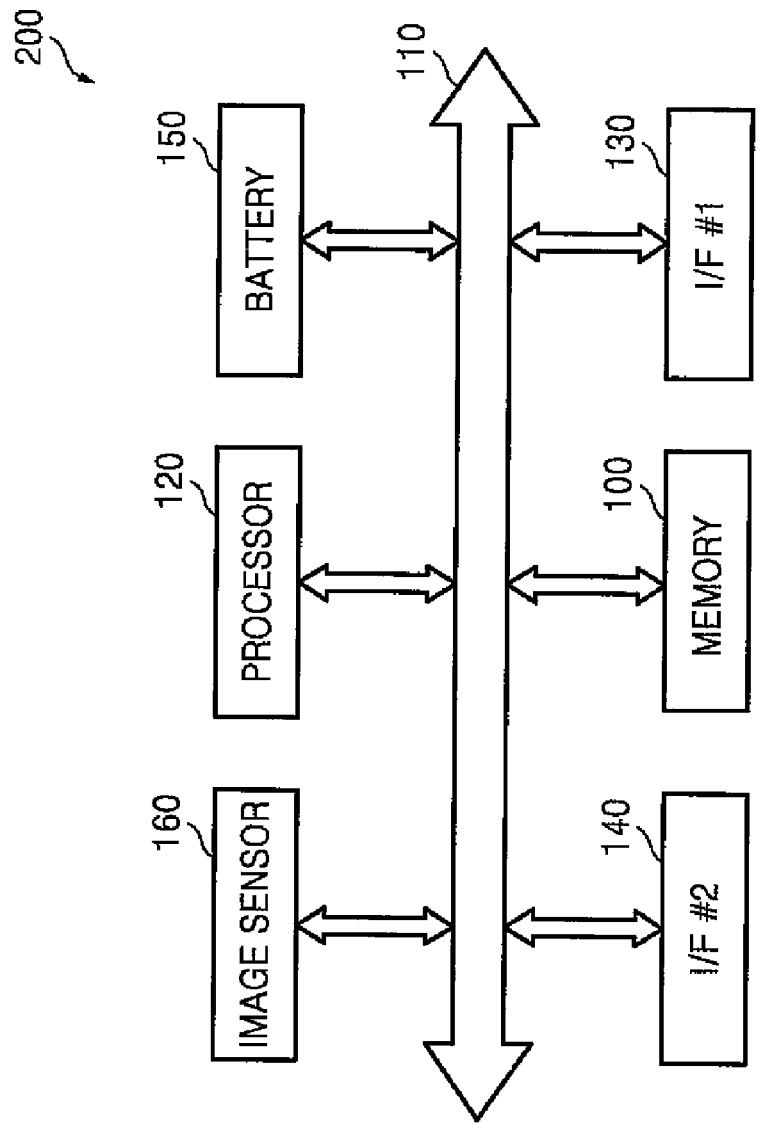
FIG. 6 is a general block diagram of a system including a memory device according to an embodiment of the inventive concept.

FIG. 6 is a general block diagram of a system 200 comprising a memory device 100 according to an embodiment of the inventive concept. That is, a high-voltage sawtooth current driving circuit according to an embodiment of the inventive concept is included within the memory device 100 to facilitate the performance of write, read, and/or erase operations.

Referring to FIG. 6, the memory system 200 also comprises a processor 120 connected to the memory device 100 by a system bus 110. The processor 120 generates control signals for controlling the program (or write), read or verify operation of the memory device 100. Accordingly, a control block (not shown) included in the memory system 200 may perform the program (or write) operation, the read operation, or the verify operation in response to a control signal output from the processor 120.

When the memory system 200 is embodied as a portable application, the memory system 200 may also include a battery 150 to supply operating power to the memory device 100 and the processor 120. The portable application may be a portable computer, a digital camera, a personal digital assistant (PDA), a cellular telephone, an MP3 player, a portable multimedia player (PMP), an automotive navigation system, a memory card, a system card, a game machine, an electronic dictionary, or a solid state disk.

The memory system 200 may also include an interface 130, e.g., an input/output unit, to communicate data with an external data processing device. When the memory system 200 is a wireless system, the memory system 200 may also include a wireless interface 140 which may be connected to the processor 120 and communicate data with an external wireless device through the system bus 110 via a wireless connection. The wireless system may be a wireless device such as PDA, a portable computer, a wireless telephone, a pager, or a digital camera; a radio frequency identification (RFID) reader; or an RFID system. The wireless system may also be a wireless local area network (WLAN) system or a wireless personal area network (WPAN) system. Moreover, the wireless system may be a cellular network.

When the memory system 200 is an image pick-up device, the memory system 200 may also include an image sensor 160 converting an optical signal into an electrical signal. The image sensor 160 may be an image sensor using a charge coupled device (CCD) or a complementary metal-oxide semiconductor (CMOS) image sensor. At this time, the memory system 200 may be a digital camera, a cellular telephone equipped with a digital camera, or a satellite system equipped with a camera.

According to certain embodiments of the inventive concept, the size of a charge pump circuit may be significantly reduced in a high-voltage sawtooth current driving circuit, so that the compactness of the high-voltage sawtooth current driving circuit and a memory device including the same may be facilitated. In addition, peak noise accompanying a pump operation may be greatly decreased in the high-voltage sawtooth current driving circuit.

While the present inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A high-voltage sawtooth current driving circuit comprising:
   a charge pump circuit configured to output a first voltage;
   a regulating circuit configured to regulate a second voltage using the first voltage output from the charge pump circuit; and
   a sawtooth current driver configured to generate a sawtooth current in response to the second voltage regulated by the regulating circuit.

2. The high-voltage sawtooth current driving circuit of claim 1, wherein the first voltage is higher than the second voltage.

3. The high-voltage sawtooth current driving circuit of claim 2, wherein the regulating circuit comprises:
   a sensing circuit configured to sense a change in the second voltage;
   a switching circuit connected between a first node at which the first voltage is apparent and a second node at which the second voltage is apparent, and configured to switch in response to an output of the sensing circuit; and
   a charge circuit connected between an output terminal of the charge pump circuit and ground.

4. The high-voltage sawtooth current driving circuit of claim 3, wherein the sensing circuit is a comparator configured to receive a signal indicative of the level of the second voltage and a reference voltage, and provide a comparison signal as the output.

5. The high-voltage sawtooth current driving circuit of claim 4, wherein the signal indicative of the level of the second voltage is derived from a voltage divider receiving the second voltage from the second node.

6. The high-voltage sawtooth current driving circuit of claim 4, wherein the signal indicative of the level of the second voltage is the second voltage directly applied to the comparator from the second node.

7. The high-voltage sawtooth current driving circuit of claim 2, wherein the regulating circuit comprises:
   a switching circuit connected between a first node at which the first voltage is apparent and a second node at which the second voltage is apparent, and configured to switch according to a change in the second voltage; and
   a charge circuit connected between an output terminal of the charge pump circuit and ground.

8. The high-voltage sawtooth current driving circuit of claim 7, wherein the switching circuit is a depletion-mode transistor and a switching operation of the depletion-mode transistor is controlled in response to a difference between a gate voltage of the depletion-mode transistor and a threshold voltage of the depletion-mode transistor, and the second voltage.

9. The high-voltage sawtooth current driving circuit of claim 1, wherein the sawtooth current driver comprises:
   a transistor controlled by pulse-shaped control signal and providing an output; and
   a mirror circuit configured to receive the output from the transistor and the second voltage to generate the sawtooth current.

10. A high-voltage sawtooth current driving circuit, comprising:
   a sawtooth current driver configured to generate a sawtooth current in response to a second voltage having a level less than a level of a first voltage provided by a charge pump circuit, wherein a pump current provided by the charge pump has a level less than a peak level of the sawtooth current; and
   a regulating circuit configured to regulate the level of the second voltage based on a difference between the sawtooth current and the pump current.

11. The high-voltage sawtooth current driving circuit of claim 10, wherein the regulating circuit comprises:
   a sensing circuit configured to sense a change in the second voltage;
   a switching circuit connected between a first node at which the first voltage is apparent and a second node at which the second voltage is apparent, and configured to switch in response to an output of the sensing circuit; and
   a charge circuit connected between an output terminal of the charge pump circuit and ground.

12. The high-voltage sawtooth current driving circuit of claim 11, wherein the sensing circuit is a comparator configured to receive a signal indicative of the level of the second voltage and a reference voltage, and provide a comparison signal as the output.

13. The high-voltage sawtooth current driving circuit of claim 10, wherein the regulating circuit comprises:
   a switching circuit connected between a first node at which the first voltage is apparent and a second node at which the second voltage is apparent, and configured to switch according to a change in the second voltage; and
   a charge circuit connected between an output terminal of the charge pump circuit and ground.

14. The high-voltage sawtooth current driving circuit of claim 13, wherein the switching circuit is a depletion-mode transistor and a switching operation of the depletion-mode transistor is controlled in response to a difference between a gate voltage of the depletion-mode transistor and a threshold voltage of the depletion-mode transistor, and the second voltage.

15. A memory device comprising:
   a high-voltage sawtooth current driving circuit configured to generate a sawtooth current; and a memory array performing at least one of write, read, and erase operations using the sawtooth current,
   wherein the high-voltage sawtooth current driving circuit comprises:
   a charge pump circuit configured to output a first voltage;
   a regulating circuit configured to regulate a second voltage using the first voltage output from the charge pump circuit; and
   a sawtooth current driver configured to generate a sawtooth current in response to the second voltage regulated by the regulating circuit.

* * * * *